(12) United States Patent
Chien et al.

(10) Patent No.: US 6,281,067 B1
(45) Date of Patent: *Aug. 28, 2001

(54) SELF-ALIGNED SILICIDE PROCESS FOR FORMING SILICIDE LAYER OVER WORD LINES IN DRAM AND TRANSISTORS IN LOGIC CIRCUIT REGION

(75) Inventors: Sun-Chieh Chien, Hsinchu; Hal Lee, Taipei; Jhy-Jeng Liu, Panchiao; Wei-Wu Liao, Taipei Hsien, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/439,932

(22) Filed: Nov. 12, 1999

(51) Int. Cl.⁷ .............................................. H01L 21/8242
(52) U.S. Cl. .................... 438/241; 438/239; 438/240; 438/253; 438/254; 438/255; 438/256; 438/396; 438/397; 438/398; 438/399
(58) Field of Search ................................ 438/241, 239, 438/240, 253–256, 396–399

(56) References Cited

U.S. PATENT DOCUMENTS

| | | | | |
|---|---|---|---|---|
| 5,866,451 | * | 2/1999 | Yoo et al. | 438/241 |
| 5,998,252 | * | 12/1999 | Huang | 438/241 |
| 6,004,843 | * | 12/1999 | Huang | 438/241 |
| 6,015,730 | * | 1/2000 | Wang et al. | 438/241 |
| 6,069,037 | * | 5/2000 | Liao | 438/241 |
| 6,074,908 | * | 6/2000 | Huang | 438/241 |
| 6,133,130 | * | 10/2000 | Lin et al. | 438/586 |
| 6,174,758 | * | 1/2001 | Nachumovsky | 438/199 |
| 6,177,306 | * | 1/2001 | Wu | 438/241 |

\* cited by examiner

Primary Examiner—John F. Niebling
Assistant Examiner—Jennifer M. Kennedy
(74) Attorney, Agent, or Firm—Thomas, Kayden, Horstemeyer & Risley, LLP

(57) ABSTRACT

A self-aligned process for forming a silicide layer over word lines in DRAM and a silicide layer over transistors in a logic device region. A substrate that includes a memory cell region and a logic circuit region is provided. A first transistor and a second transistor are formed over the substrate. The first transistor is formed in the logic circuit region and includes a first gate conductive layer and a first source/drain region. The second transistor is formed in the memory cell region and includes a second gate conductive layer and a second source/drain region. A blocking layer is formed over both the first transistor and the second transistor. A portion of the blocking layer is removed to expose the first gate conductive layer, the first source/drain region and the second gate conductive layer. The remaining blocking layer still covers the second source/drain region. A metal silicide layer is formed over the first gate conductive layer, the first source/drain region and the second gate conductive layer.

11 Claims, 2 Drawing Sheets

SELF-ALIGNED SILICIDE PROCESS FOR FORMING SILICIDE LAYER OVER WORD LINES IN DRAM AND TRANSISTORS IN LOGIC CIRCUIT REGION

BACKGROUND OF THE INVENTION

1. Field of the Invention

The present invention relates to a self-aligned silicide (Salicide) process. More particularly, the present invention relates to a self-aligned silicide process for forming embedded dynamic random access memory (DRAM).

2. Description of the Related Art

In a conventional embedded memory, memory transistors and logic circuit transistors are formed on the same piece of wafer. The advantages of integrating memory and logic transistors together include an increase yield, a shorter cycle time and a lower manufacturing cost. However, due to the different needs of memory transistors and logic transistors, processing steps must be adjusted accordingly. For example, response from logic devices must be as quick as possible. On the other hand, the inter-refreshing time of memory capacitors must be as long as possible. Therefore, the memory transistors must be fabricated in a manner slightly different from the logic devices.

FIG. 1 is a schematic cross-sectional view showing a portion of a conventional embedded DRAM with both logic devices and memory cell transistors therein.

As shown in FIG. 1, a substrate 100 that includes a logic device region 102 and a memory cell region 104 is provided. Two transistors 108 and 110 and a capacitor 112 together in the memory cell region 104 constitute a DRAM cell. A transistor 106 is formed in the logic device region 102.

To increase the speed of operation of the transistor 106 in the logic device region 102, self-aligned silicide layers 114 are formed over the transistor terminal regions. However, in order to extend the inter-refreshing period of memory cell, resistance at the junction between the capacitor 112 and the source/drain region 116 of the transistor 110 must be increased. Consequently, a silicide layer is usually not formed over the source/drain regions of the transistors 108 and 110 in the memory cell region 104.

In general, before self-aligned silicide layers are formed over the terminal regions of the transistor 106, a blocking layer is formed over the transistors 108 and 110. The blocking layer is removed after the self-aligned silicide process is complete.

Since no silicide layer covers the source/drain regions 116 of the transistors 108 and 110, resistance at source/drain junctions is high. However, due to the absence of a silicide layer, resistance at the word line or gate junctions of the transistors 108 and 110 will also be high. Hence, operating speed of the memory cell will drop.

Ideally, silicide layers are formed over the gate terminals and the source/drain terminals of transistors in the logic device region as well as the gate word lines of transistors in the memory cell region. No silicide layer is formed over the source/drain regions of the transistors in the memory cell region. However, such a configuration can hardly be achieved through a conventional process.

SUMMARY OF THE INVENTION

The invention provides a self-aligned process for forming a silicide layer. A substrate that includes a memory cell region and a logic circuit region is provided. A first transistor and a second transistor are formed over the substrate. The first transistor is formed in the logic circuit region and includes a first gate conductive layer and a first source/drain region. The second transistor is formed in the memory cell region and includes a second gate conductive layer and a second source/drain region. A blocking layer is formed over both the first transistor and the second transistor. A portion of the blocking layer is removed to expose the first gate conductive layer, the first source/drain region and the second gate conductive layer. The remaining blocking layer still covers the second source/drain region. A metal silicide layer is formed over the first gate conductive layer, the first source/drain region and the second gate conductive layer.

According to one embodiment of this invention, the steps of removing a portion of the blocking layer include forming a patterned photoresist layer over the second source/drain region. The blocking layer is etched to expose the first gate conductive layer, the first source/drain region and the second gate conductive layer while using the patterned photoresist layer as an etching mask. The patterned photoresist layer is removed.

According to one embodiment of this invention, the steps of forming the patterned photoresist layer include depositing photoresist material over the blocking layer to form a photoresist layer. The photoresist layer is next patterned to remove the portion of photoresist layer in the logic circuit region. The remaining photoresist layer is etched back to expose the blocking layer above the second gate conductive layer. The residual photoresist layer becomes the patterned photoresist layer above the second source/drain region in the aforementioned description.

According to another embodiment of this invention, the patterned photoresist layer can be formed by depositing photoresist material over the blocking layer to form a photoresist layer. The photoresist layer is next exposed to light through a special photomask. Transparency of the photomask in region that corresponds to the memory cell region is only about 20% to 80% of the transparency of the photomask in region that corresponds to the logic circuit region. The light-exposed photoresist layer is developed to form the patterned photoresist layer.

Accordingly, the present invention is to provide a self-aligned silicide process capable of forming silicide layers over the gate word lines in DRAM and silicide layers over the transistors in a logic circuit region. In other words, silicide layers are formed over the transistor terminals in the logic device region as well as over the gate word lines of transistors in the memory cell region. However, no silicide layer is formed over the source/drain regions of the transistors in the memory cell region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
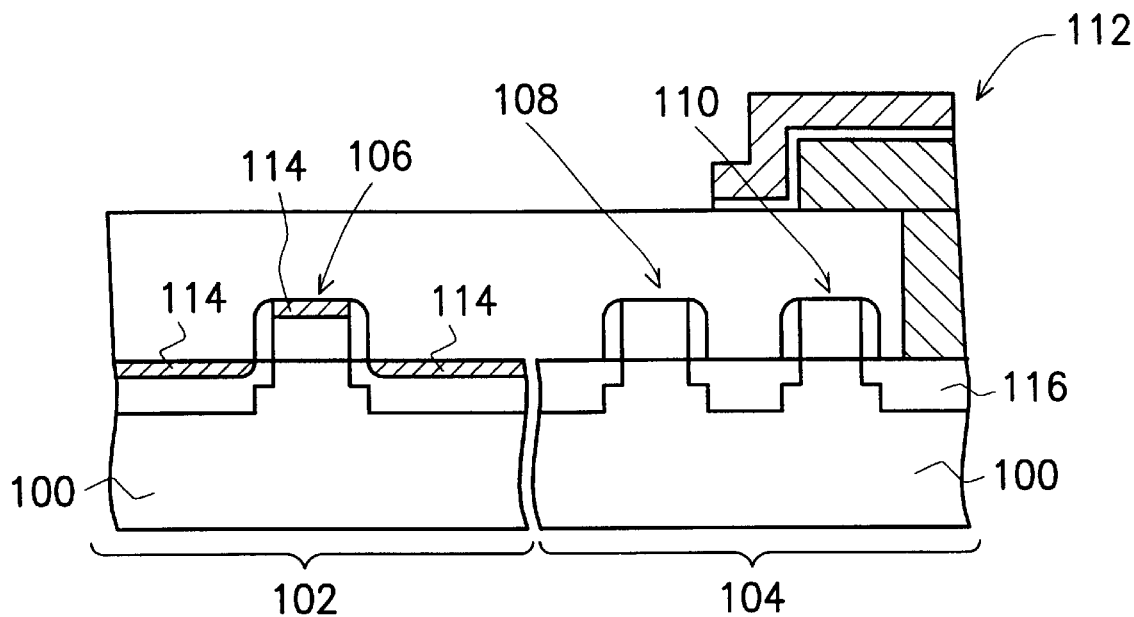
FIG. 1 is a schematic cross-sectional view showing a portion of a conventional embedded DRAM with both logic devices and memory cell transistors therein.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic cross-sectional views showing the steps in a self-aligned silicide process for producing a silicide layer over the word lines in DRAM and the transistors in a logic circuit region according to this invention.

Figure 2A:
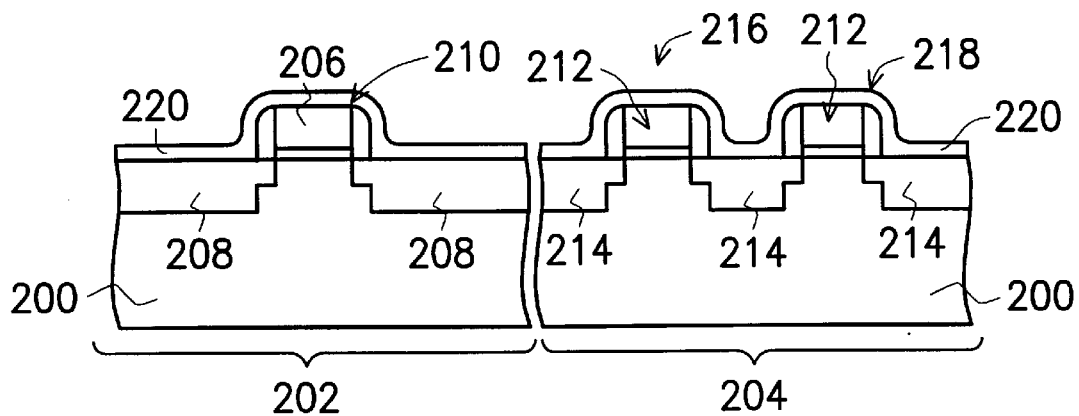
FIGS. 2A through 2E are schematic cross-sectional views showing the steps in a self-aligned silicide process for producing a silicide layer over the word lines in DRAM and the transistors in a logic circuit region according to this invention.

As shown in FIG. 2A, a substrate 200 is provided. The substrate 200 is divided into a logic circuit region 202 for accommodating logic devices and a memory cell region 204 for accommodating memory devices. A transistor 210 having a gate conductive layer 206 and source/drain regions 208 is formed in the logic circuit region 202. Transistors 216 and 218 having gate conductive layers 212 and source/drain regions 214 are formed in the memory cell region 204.

A global blocking layer 220 is formed over the transistors 210, 216 and 218 so that the gate conductive layers 206, 212 and the source/drain regions 208, 214 are all covered. The blocking layer 220 can be a silicon nitride layer or a silicon oxide layer formed, for example, by chemical vapor deposition or some other suitable methods.

Figure 2B:
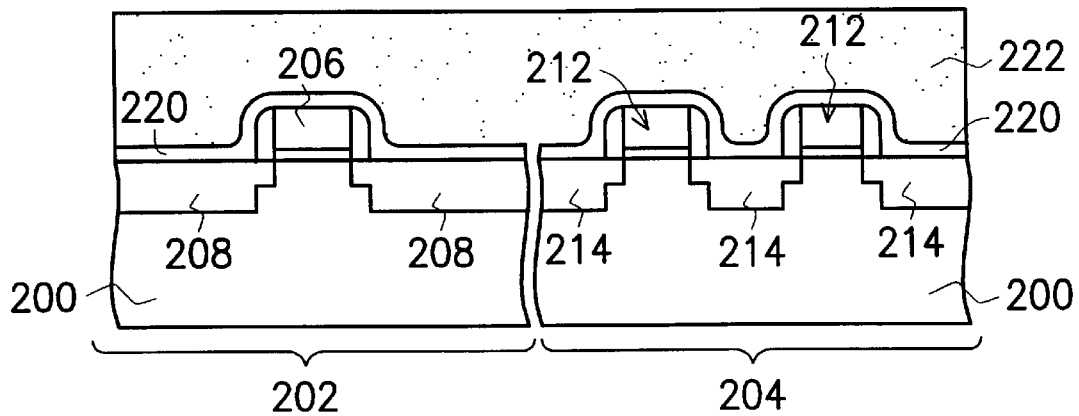

As shown in FIG. 2B, a photoresist layer 222 is formed over the blocking layer 220. The photoresist layer 222 is formed by a conventional photolithographic process.

Figure 2C:
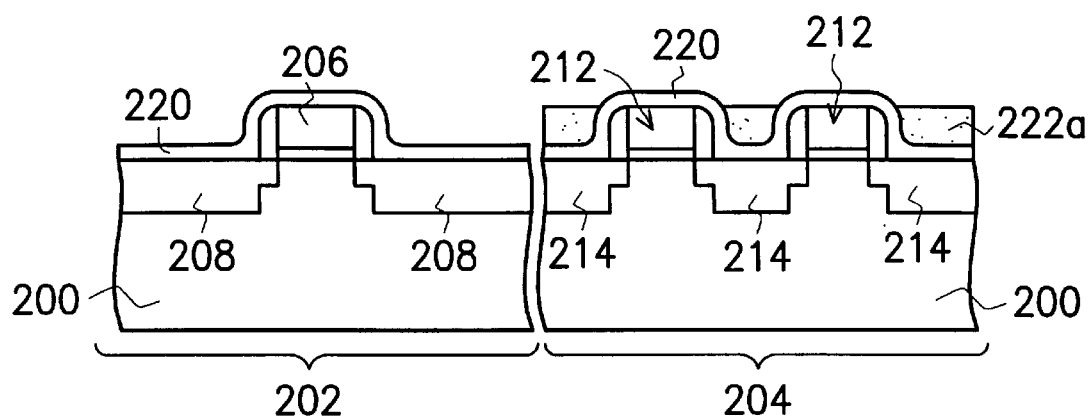

As shown in FIG. 2C, a portion of the photoresist layer 222 is removed so that a patterned photoresist layer 222a is formed over the source/drain terminals 214 in the memory cell region. Hence, the blocking layer 220 above the gate conductive layers 206, 212 and the source/drain regions 208 is exposed.

There are two principle methods of forming the patterned photoresist layer 222a. In the first method, the photoresist layer 222 is patterned to remove photoresist material from the logic circuit region 202. The remaining photoresist layer 222 in the memory cell region 204 is etched back to expose the blocking layer 222 above the gate conductive layer 212. An etchant capable of removing the photoresist material but not the material in the blocking layer 220 is chosen. The residual photoresist layer 222 remaining in the memory cell region 204 is the patterned photoresist layer 222a.

In the second method of forming the patterned photoresist layer 222a, a photomask having different transparency in different regions is used for exposing the photoresist layer 222 to light. Transparency of the photomask in the region that corresponds to the memory cell 204 region is only about 20% to 80% of the transparency of the photomask in the region that corresponds to the logic circuit region 202. Hence, when the photoresist layer 222 is exposed to light passing through the photomask, light intensity in the memory cell region 204 is smaller than light intensity in the logic circuit region 202. Since only low-intensity light reaches the photoresist layer 222 in the memory cell region 204, a residual photoresist layer remains over the source/drain terminals 214 in the memory cell region 204 after photoresist development.

The residual photoresist layer remaining in the memory cell region 204 is the patterned photoresist layer 222a.

Figure 2D:
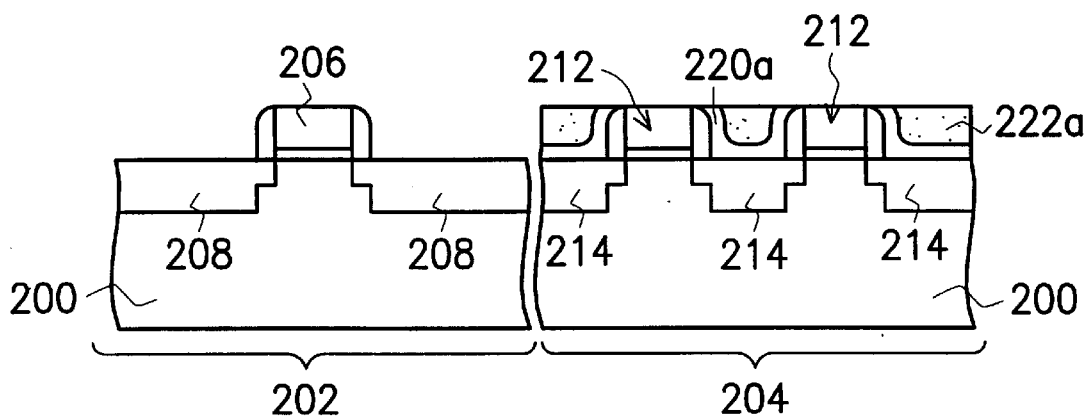

As shown in FIG. 2D, the exposed blocking layer 220 is removed to expose the gate conductive layers 206, 212 and the source/drain regions 208. The source/drain 5 regions 214 are still covered by the blocking layer 220. The blocking layer 220 is removed, for example, by dry etching or wet etching using the patterned photoresist layer 222a as a mask.

Figure 2E:
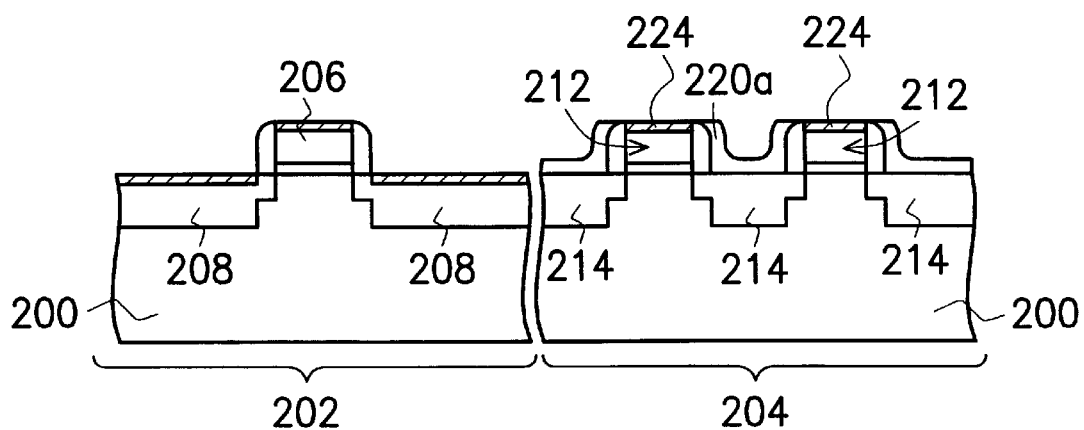

As shown in FIG. 2E, the patterned photoresist layer 222a is removed. A metal silicide layer 224 is formed over the gate conductive layers 206, 212 and the source/drain regions 208. The metal silicide layer 224 can be a titanium silicide or a cobalt silicide layer. The metal silicide layer 224 is formed, for example, by globally depositing metallic material over the gate conductive layers 206, 212 and the source/drain regions 208 to form a metallic layer (not shown in the figure). The metallic layer is next thermally annealed (for example, in a rapid thermal process) so that metal in the metallic layer reacts with silicon on the gate conductive layers 206, 212 and the source/drain regions 208. The unreacted metal is later removed, for example, by wet etching.

In summary, the advantages of this invention include:

1. By forming a self-aligned silicide layer over the word line in DRAM and over transistors in the logic circuit region in a processing step, operating speed of both logic devices and memory cell increases. Furthermore, since no metal silicide layer covers the source/drain terminals in the memory cell region, inter-refreshing time can be increased.

2. The method has high processing compatibility with conventional methods. Hence, device quality can be improved without extensive modification of existing manufacturing facilities.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A self-aligned silicide process for forming a silicide layer over word lines in a memory cell region of a substrate and a silicide layer over transistors in a logic circuit region of the substrate, comprising the steps of:

forming a first transistor and a second transistor in the substrate, wherein the first transistor is formed inside the logic circuit region and includes a first gate conductive layer and a first source/drain region, and wherein the second transistor is formed inside the memory cell region and includes a second gate conductive layer and a second source/drain region;

forming a silicon nitride blocking layer over the first transistor, the second transistor and the substrate;

removing a portion of the blocking layer to expose the first gate conductive layer, the first source/drain region and the second gate conductive layer such that the second source/drain region is still covered by the remaining blocking layer; and forming a metal silicide layer over the first gate conductive layer, the first source/drain region and the second gate conductive layer.

2. The method of claim 1, wherein the step of removing a portion of the blocking layer includes the substeps of:

forming a patterned photoresist layer over the second source/drain region;

etching the blocking layer to expose the first gate conductive layer, the first source/drain region and the second gate conductive layer, while using the patterned photoresist layer as an etching mask; and removing the patterned photoresist layer.

3. The method of claim 2, wherein the step of forming the patterned photoresist layer includes the substeps of:

depositing photoresist material over the blocking layer to form a photoresist layer;

patterning the photoresist layer to remove photoresist material from the logic circuit region; and etching back the photoresist layer in the memory cell region to expose the blocking layer above the second gate conductive layer, wherein a residual photoresist becomes the patterned photoresist layer.

4. The method of claim 2, wherein the step of forming the patterned photoresist layer includes the substeps of:

depositing photoresist material over the blocking layer to form a photoresist layer;

providing a photomask, wherein a transparency of the photomask in a region that corresponds to the memory cell region is only about 20% to 80% of a transparency of the photomask in a region that corresponds to the logic circuit region;

exposing the photoresist layer through the photomask; and developing the photoresist layer to form the patterned photoresist layer.

5. The method of claim 1, wherein the step of forming the blocking layer includes depositing silicon nitride.

6. The method of claim 1, wherein the step of forming the blocking layer includes depositing silicon oxide.

7. The method of claim 1, wherein the step of forming the salicide layer more specifically includes forming titanium silicide.

8. The method of claim 1, wherein the step of forming the salicide layer more specifically includes forming cobalt silicide.

9. The method of claim 1, wherein the step of forming the self-aligned silicide layer includes the substeps of:

forming a metallic layer globally over the substrate to cover the exposed first gate conductive layer, the exposed first source/drain region and the exposed second gate conductive layer;

conducting a thermal annealing operation, wherein the metallic layer reacts with silicon on the first gate conductive layer, the first source/drain region and the second gate conductive layer to form a metal silicide layer; and removing unreacted metallic layer.

10. A self-aligned silicide process for forming a silicide layer over word lines in a memory cell region of a substrate and a silicide layer over transistors in a logic circuit region of the substrate, comprising the steps of:

forming a first transistor and a second transistor in the substrate, wherein the first transistor is formed inside the logic circuit region and includes a first gate conductive layer and a first source/drain region, and wherein the second transistor is formed inside the memory cell region and includes a second gate conductive layer and a second source/drain region;

forming a blocking layer over the first transistor, the second transistor and the substrate;

forming a photoresist layer over the blocking layer;

patterning the photoresist layer to remove photoresist material from the logic circuit region;

etching back the photoresist layer in the memory cell region to expose the blocking layer above the second gate conductive layer so that a residual photoresist layer becomes a patterned photoresist layer;

etching the blocking layer to expose the first gate conductive layer, the first source/drain region and the second gate conductive layer, while using the patterned photoresist layer as an etching mask;

removing the patterned photoresist layer so that the second source/drain region is still covered by a remaining blocking layer; and forming a metal silicide layer over the first gate conductive layer, the first source/drain region and the second gate conductive layer.

11. A self-aligned silicide process for forming a silicide layer over word lines in a memory cell region of a substrate and a silicide layer over transistors in a logic circuit region of the substrate, comprising the steps of:

forming a first transistor and a second transistor in the substrate, wherein the first transistor is formed inside the logic circuit region and includes a first gate conductive layer and a first source/drain region, and wherein the second transistor is formed inside the memory cell region and includes a second gate conductive layer and a second source/drain region;

forming a blocking layer over the first transistor, the second transistor and the substrate;

forming a photoresist layer over the blocking layer;

providing a photomask, wherein a transparency of the photomask in a region that corresponds to the memory cell region is only about 20% to 80% of a transparency of the photomask in a region that corresponds to the logic circuit region;

exposing the photoresist layer through the photomask;

developing the photoresist layer to remove the photoresist layer in the logic circuit region and the photoresist layer over the second gate conductive layer so that a residual photoresist layer remains over the second source/drain region and becomes a patterned photoresist layer;

etching the blocking layer to expose the first gate conductive layer, the first source/drain region and the second gate conductive layer, while using the patterned photoresist layer as an etching mask;

removing the patterned photoresist layer, wherein the second source/drain region is still covered by a remaining blocking layer; and forming a metal silicide layer over the first gate conductive layer, the first source/drain region and the second gate conductive layer.

* * * * *